US012630744B2

(12) United States Patent
Huang et al.

(10) Patent No.: US 12,630,744 B2
(45) Date of Patent: May 19, 2026

(54) POLISHING COMPOSITIONS AND METHODS OF USE THEREOF

(71) Applicant: Fujifilm Electronic Materials U.S.A., Inc., N. Kingstown, RI (US)

(72) Inventors: Ting-Kai Huang, Tainan City (TW); Yannan Liang, Gilbert, AZ (US); Bin Hu, Chandler, AZ (US); Chun-Fu Chen, Zhubei City (TW); Ying-Shen Chuang, Taoyuan City (TW); Tzu-Wei Chiu, Caotun Township (TW); Sung Tsai Lin, Taoyuan City (TW); Hanyu Fan, Chandler, AZ (US); Hsin-Hsien Lu, Hsinchu City (TW)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 146 days.

(21) Appl. No.: 18/515,857

(22) Filed: Nov. 21, 2023

(65) Prior Publication Data

US 2024/0174892 A1 May 30, 2024

Related U.S. Application Data

(60) Provisional application No. 63/428,550, filed on Nov. 29, 2022.

(51) Int. Cl.
| | |
|---|---|
| *C09G 1/02* | (2006.01) |
| *B24B 37/04* | (2012.01) |
| *C09G 1/00* | (2006.01) |
| *C09K 3/14* | (2006.01) |
| *H10P 52/40* | (2026.01) |

(52) U.S. Cl.
CPC .............. *C09G 1/02* (2013.01); *B24B 37/044* (2013.01); *C09G 1/00* (2013.01); *C09K 3/1454* (2013.01); *C09K 3/1463* (2013.01); *H10P 52/402* (2026.01); *H10P 52/403* (2026.01)

(58) Field of Classification Search
None
See application file for complete search history.

(56) References Cited

U.S. PATENT DOCUMENTS

| | | | |
|---|---|---|---|
| 8,545,715 | B1 | 10/2013 | Wang et al. |
| 2003/0228763 | A1 | 12/2003 | Schroeder et al. |
| 2008/0105652 | A1 | 5/2008 | Brusic et al. |
| 2008/0148649 | A1 | 6/2008 | Liu |
| 2010/0096584 | A1 | 4/2010 | Saeki |
| 2015/0344738 | A1 | 12/2015 | Onishi |
| 2016/0068710 | A1 | 3/2016 | Wang et al. |
| 2016/0107286 | A1 | 4/2016 | Sakashita et al. |
| 2016/0244639 | A1 | 8/2016 | Li et al. |
| 2018/0258319 | A1 | 9/2018 | Akutsu |
| 2019/0300750 | A1 | 10/2019 | Lin et al. |

| | | | |
|---|---|---|---|
| 2020/0090983 | A1 | 3/2020 | Lee |
| 2020/0102476 | A1 | 4/2020 | Gan |
| 2021/0087431 | A1* | 3/2021 | Liang .................. H01L 21/3212 |
| 2021/0108106 | A1 | 4/2021 | Liang et al. |
| 2021/0253903 | A1 | 8/2021 | Huang |
| 2021/0253904 | A1 | 8/2021 | Huang et al. |
| 2021/0261822 | A1 | 8/2021 | Lin |
| 2021/0301177 | A1 | 9/2021 | McDonough |
| 2022/0162478 | A1 | 5/2022 | Lin |
| 2023/0135325 | A1 | 5/2023 | Liang |
| 2023/0348754 | A1 | 11/2023 | Liang |
| 2025/0333622 | A1 | 10/2025 | Huang et al. |

FOREIGN PATENT DOCUMENTS

| | | |
|---|---|---|
| CN | 101205442 | 6/2008 |
| CN | 101535442 | 9/2009 |
| CN | 103930976 | 7/2014 |
| CN | 108239484 A | 7/2018 |
| EP | 3628714 | 4/2020 |
| JP | 2013-533614 A | 8/2013 |
| JP | 2019-156990 A | 9/2019 |
| KR | 10-2009-0086421 | 8/2009 |
| TW | 201506099 | 2/2015 |
| WO | WO 2014/175397 A1 | 10/2014 |
| WO | WO 2019/131448 | 7/2019 |
| WO | WO 2019/190730 A2 | 10/2019 |

OTHER PUBLICATIONS

International Preliminary Report on Patentability in International Appln. No. PCT/US2023/080746, mailed on Jun. 12, 2025, 6 pages.
Office Action in Japanese Appln. No. 2022-549238, dated Dec. 10, 2024, 8 pages (with English translation).
Extended European Search Report in European Appln No. 21753150.8, dated Jul. 14, 2023, 6 pages.
International Search Report and Written Opinion in International Appln. No. PCT/US2023/080746, mailed on Mar. 13, 2024, 8 pages.
International Search Report and Written Opinion of the International Searching Authority for International Application No. PCT/US2021/017049, dated Apr. 27, 2021.
Office Action in Chinese Appln. No. 202180009070.1, dated Jun. 5, 2024, 13 pages (with English translation).
Office Action in Chinese Appln. No. 202180009070.1, dated Sep. 4, 2024, 13 pages (with English translation).
Search Report in Singapore Appln. No. 11202252037H, mailed on Mar. 13, 2024, 11 pages.
Office Action in Korean Appln. No. 10-2022-7031237, dated Oct. 1, 2025, 13 pages (with English translation).
Extended European Search Report in European Appln. No. 23898589.9, mailed on Feb. 26, 2026, 8 pages.
Office Action in Singapore Appln. No. 11202252037H, mailed on Feb. 27, 2026, 6 pages.

* cited by examiner

*Primary Examiner* — Jiong-Ping Lu
(74) *Attorney, Agent, or Firm* — Fish & Richardson P.C.

(57) ABSTRACT

This disclosure relates to a polishing composition that includes an abrasive, at least two pH adjusters, a barrier film removal rate enhancer, a low-k removal rate inhibitor; and an azole-containing corrosion inhibitor. This disclosure also features a method of using the polishing composition to polish a substrate containing copper and silicon oxide.

24 Claims, No Drawings

POLISHING COMPOSITIONS AND METHODS OF USE THEREOF

CROSS-REFERENCE TO RELATED APPLICATION

The present application claims priority to U.S. Provisional Application Ser. No. 63/428,550, filed on Nov. 29, 2022, the contents of which are hereby incorporated by reference in their entirety.

BACKGROUND

The semiconductor industry is continually driven to improve chip performance by further miniaturization of devices through process and integration innovations. Chemical Mechanical Polishing/Planarization (CMP) is a powerful technology as it makes many complex integration schemes at the transistor level possible, thereby facilitating increased chip density.

CMP is a process used to planarize/flatten a wafer surface by removing material using abrasion-based physical processes concurrently with surface-based chemical reactions. In general, a CMP process involves applying a CMP slurry (aqueous chemical formulation) to a wafer surface while contacting the wafer surface with a polishing pad and moving the polishing pad in relation to the wafer. Slurries typically include an abrasive component and dissolved chemical components, which can vary significantly depending upon the materials (e.g., metals, metal oxides, metal nitrides, dielectric materials such as silicon oxide, silicon nitride, etc.) present on the wafer that will be interacting with the slurry and the polishing pad during the CMP process.

Many currently available CMP slurries were specifically designed to remove materials more common in older chip designs. However, chip designs and architectures are constantly changing and certain components in these older CMP slurries may cause deleterious and/or unacceptable defect counts.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

As defined herein, unless otherwise noted, all percentages expressed should be understood to be percentages by weight to the total weight of the chemical mechanical polishing composition.

In one aspect, embodiments disclosed herein relate to a polishing composition that includes an abrasive, at least two pH adjusters containing at least one inorganic base and at least one organic base, where the molar ratio of the at least one organic base to the at least one inorganic base is from about 0.05 to about 2; a barrier film removal rate enhancer; a low-k removal rate inhibitor; and an azole-containing corrosion inhibitor.

In yet another aspect, embodiments disclosed herein relate to a method of polishing a substrate, including the steps of: applying a polishing composition described herein to a surface of a substrate, in which the surface includes copper and silicon oxide; and bringing a pad into contact with the surface of the substrate and moving the pad in relation to the substrate.

Other aspects and advantages of the claimed subject matter will be apparent from the following description and the appended claims.

DETAILED DESCRIPTION

Embodiments disclosed herein relate generally to compositions and methods of using said compositions to polish substrates that include at least a copper portion and may, more specifically, include at least silicon oxide and copper portions. In some embodiments, it is desirable to remove the silicon oxide and copper at a similar removal rate. The present inventors surprisingly discovered that the compositions disclosed herein can effectively suppress oxide dishing and edge-of-erosion, minimize copper line height differences between the thin and wide lines, and reduce abrasive related particle residue on the wafer surface after polishing, while still effectively maintaining a similar removal rate between copper and silicon oxide. For example, the compositions disclosed herein can be particularly useful for polishing advanced node films that include copper, a ruthenium liner, barrier (e.g., Ta, TaN) and dielectric materials (e.g., TEOS, low-k, ultra low-k, etc.)

In one or more embodiments, the polishing composition described herein includes an abrasive; at least two pH adjusters, where at least one pH adjuster is an inorganic base and at least one pH adjuster is an organic base; a barrier film removal rate enhancer; a low-k removal rate inhibitor; and an azole-containing corrosion inhibitor. In one or more embodiments, a polishing composition according to the present disclosure can include from about 0.1% to about 50% by weight abrasive, about 0.05% to about 10% by weight total pH adjuster (i.e., including both the inorganic and organic bases), about 0.02% to about 4% by weight barrier film removal rate enhancer, about 0.005% to about 5% by weight low-k removal rate inhibitor, about 0.0001% to about 1% by weight azole-containing corrosion inhibitor, and the remaining percent by weight (e.g., from about 20% to about 99% by weight) of solvent (e.g., deionized water).

In one or more embodiments, the present disclosure provides a concentrated polishing composition that can be diluted with water prior to use by up to a factor of two, or up to a factor of four, or up to a factor of six, or up to a factor of eight, or up to a factor of ten. In other embodiments, the present disclosure provides a point-of-use (POU) polishing composition comprising the above-described polishing composition, water, and optionally an oxidizer for use on a substrate (e.g., a substrate containing copper and a silicon oxide).

In one or more embodiments, a POU polishing composition can include from about 0.1% to about 12% by weight abrasive, about 0.05% to about 5% by weight total pH adjuster (i.e., including both the inorganic and organic bases), about 0.02% to about 2% by weight barrier film removal rate enhancer, about 0.005% to about 0.5% by weight low-k removal rate inhibitor, about 0.0001% to about 0.1% by weight azole-containing corrosion inhibitor, optionally about 0.1% to about 5% by weight oxidizer, and about 80% to about 99% by weight of solvent (e.g., deionized water). In one or more embodiments, the POU polishing composition can further include about 0.001% to about 0.1% by weight chelating agent.

In one or more embodiments, a concentrated polishing composition can include from about 1% to about 50% by weight abrasive, about 0.5% to about 10% by weight total pH adjuster (i.e., including both the inorganic and organic bases), about 0.2% to about 4% by weight barrier film removal rate enhancer, about 0.05% to about 5% by weight low-k removal rate inhibitor, about 0.001% to about 1% by weight azole-containing corrosion inhibitor, and the remaining percent by weight (e.g., from about 20% to about 98.5% by weight) of solvent (e.g., deionized water). In one or more embodiments, the concentrated polishing composition can further include from about 0.01% to about 1% by weight chelating agent.

In one or more embodiments, the polishing composition described herein can include at least one (e.g., two or three) abrasive. In some embodiments, the at least one abrasive is selected from the group consisting of cationic abrasives, substantially neutral abrasives, and anionic abrasives. In one or more embodiments, the at least one abrasive is selected from the group consisting of alumina, silica, titania, ceria, zirconia, co-formed products thereof (i.e., co-formed products of alumina, silica, titania, ceria, or zirconia), coated abrasives, surface modified abrasives, and mixtures thereof. In some embodiments, the at least one abrasive does not include ceria. In some embodiments, the at least one abrasive is high-purity, and can have less than about 100 ppm of alcohol, less than about 100 ppm of ammonia, and less than about 100 parts per billion (ppb) of an alkali cation such as sodium cation. The abrasive can be present in an amount of from about 0.1% to about 12% (e.g., from about 0.5% to about 10%), based on the total weight of the POU polishing composition, or any subranges thereof.

In some embodiments, the at least one abrasive is in an amount of from at least about 0.1% (e.g., at least about 0.5%, at least about 1%, at least about 2%, at least about 4%, at least about 5%, at least about 10%, at least about 12%, at least about 15%, or at least about 20%) by weight to at most about 50% (e.g., at most about 45%, at most about 40%, at most about 35%, at most about 30%, at most about 25%, at most about 20%, at most about 15%, at most about 12%, at most about 10%, or at most about 5%) by weight of the polishing composition described herein.

In one or more embodiments, the at least one abrasive can have a mean particle size of from at least about 1 nm (e.g., at least about 5 nm, at least about 10 nm, at least about 20 nm, at least about 40 nm, at least about 50 nm, at least about 60 nm, at least about 80 nm, or at least about 100 nm) to at most about 1000 nm (e.g., at most about 800 nm, at most about 600 nm, at most about 500 nm, at most about 400 nm, at most about 200 nm, at most about 150 nm, or at most about 100 nm). As used herein, the mean particle size (MPS) is determined by dynamic light scattering techniques.

In one or more embodiments, the polishing composition described herein can include at least two (e.g., three or four) pH adjusters. In one or more embodiments, the polishing composition described herein can include a single pH adjuster that is either an inorganic base or an organic base. In one or more embodiments, the pH adjusters include at least one (e.g., two) inorganic base and at least one (e.g., two) organic base. In some embodiments, the inorganic base can be selected from the group consisting of ammonium hydroxide, sodium hydroxide, potassium hydroxide, cesium hydroxide, rubidium hydroxide, and any combinations thereof.

In one or more embodiments, the pH adjusters include a first organic base and optionally a second organic base different from the first organic base. In some embodiments, the first organic base is a quaternary ammonium hydroxide (e.g., an alkylammonium hydroxide such as a tetraalkylammonium hydroxide), a quaternary phosphonium hydroxide (e.g., an alkylphosphonium hydroxide such as a tetraalkylphosphonium hydroxide), or a guanidine compound (e.g., guanidine or a compound that includes a guanidine group). In one or more embodiments, the quaternary ammonium hydroxide is selected from the group consisting of tetrabutylammonium hydroxide, ethyltrimethylammonium hydroxide, tetrapropylammonium hydroxide, tetraethylammonium hydroxide, tetramethylammonium hydroxide, diethyldimethylammonium hydroxide, dimethyldipropylammonium hydroxide, benzyltrimethylammonium hydroxide, and any combinations thereof. In one or more embodiments, the quaternary phosphonium hydroxide is selected from the group consisting of tetramethylphosphonium hydroxide, tetraethylphosphonium hydroxide, tetrapropylphosphonium hydroxide, tetrabutylphosphonium hydroxide, tetrapentylphosphonium hydroxide, triethyl-methylphosphonium hydroxide, tetrakis(hydroxymethyl)phosphonium hydroxide, tetraphenylphosphonium hydroxide, and any combinations thereof. In one or more embodiments, the first organic base (i.e., the quaternary ammonium hydroxide or quaternary phosphonium hydroxide) does not include covalently bound hydroxyl groups (e.g., does not include choline hydroxide or tris(2-hydroxyethyl)methylammonium hydroxide). In one or more embodiments, the guanidine compound is selected from the group consisting of guanidine, metformin, phenformin, buformin, proguanil, moroxydine, 1,3-diphenylguanidine, 1,1,3,3-tetramethylguanidine, 1,2,3-triphenylguanidine, 1-(tert-butoxycarbonyl)guanidine, creatinol phosphate, N-tosyl-L-arginine, 1,3-di-o-tolylguanidine, and any combinations thereof.

In one or more embodiments, the optional second organic base does not include a quaternary ammonium hydroxide or quaternary phosphonium hydroxide. In one or more embodiments, the optional second organic base is selected from the group consisting of alkylamines, aminoalcohols, guanidines, cyclic amines, and mixtures thereof. In one or more embodiments, the optional second organic base is selected from the group consisting of monomethylamine, dimethylamine, trimethylamine, monoethylamine, diethylamine, (triethyl)amine, monopropylamine, dipropylamine, tri-n-propylamine, monobutylamine, dibutylamine, tributylamine, 2-aminopropane (isopropylamine), ethanolamine, diethanolamine, triethanolamine, 2-amino-2-methyl-1-propanol, 2-amino-2-methyl-1,3-propanediol, 2-dimethylamino-2-methylpropanol, tris(hydroxymethyl)aminomethane, 2-amino-2-ethyl-1,3-propanediol, 3-amino-4-octanol, aminopropyldiethanolamine, 2-[(3-aminopropyl)methylamino]ethanol, 2-(2-aminoethoxy)ethanol, 2-(3-aminopropylamino)ethanol, 2-dimethylaminoethanol, cysteamine, guanidine, metformin, phenformin, buformin, proguanil, moroxydine, 1,3-diphenylguanidine, 1,1,3,3-tetramethylguanidine, 1,2,3-triphenylguanidine, 1-(tert-butoxycarbonyl)guanidine, creatinol phosphate, N-tosyl-L-arginine, 1,3-di-o-tolylguanidine, 1,8-diazabicyclo[2.2.2]octane, 1,8-diazabicyclo[4.3.0]non-5-ene, 1,8-diazabicyclo[5.4.0]undec-7-ene, and mixtures thereof.

In one or more embodiments, the combined amount of the pH adjusters (e.g., the at least one inorganic base and the at least one organic base (e.g., including the optional second organic base if present)) is from at least about 0.05% (e.g., at least about 0.1%, at least about 0.2%, at least about 0.4%, at least about 0.5%, at least about 0.8%, at least about 1%, at least about 2%, at least about 5%, or at least about 7%) by weight to at most about 10% (e.g., at most about 9%, at most about 8%, at most about 7%, at most about 6%, at most about 5%, at most about 4%, at most about 3%, at most about 2%, at most about 1%, at most about 0.5%, at most about 0.2%, or at most about 0.1%) by weight of the polishing composition described herein. In one or more embodiments, the molar ratio of the total amount of the organic bases (e.g., the first organic base and the optional second organic base) to the total amount of the inorganic bases (e.g., organic bases:inorganic bases) can be a value from at least about 0.05 (e.g., at least about 0.1, at least about 0.2, at least about 0.3, at least about 0.4, at least about 0.5, at least about 0.6, at least about 0.7, at least about 0.8, at least about 0.9, at least about 1, at least about 1.1, at least about 1.2, or at least about 1.3) to at most about 2 (e.g., at most about 1.9, at most about 1.8, at most about 1.7, at most about 1.6, at most about 1.5, at most about 1.4, at most about 1.3, at most about 1.2, at most about 1.1, at most about 1, at most about 0.9, at most about 0.8, at most about 0.7, at most about 0.6, or at most about 0.5).

In one or more embodiments, the pH value of the polishing composition can range from at least about 7 (e.g., at least about 7.5, at least about 8, at least about 8.5, at least about 9, at least about 9.5, at least about 10, at least about 10.5, at least about 11, at least about 11.5, or at least about 12) to at most about 14 (e.g., at most about 13.5, at most about 13, at most about 12.5, at most about 12, at most about 11.5, at most about 11, at least about 10.5, at most about 10, at most about 9.5, or at most about 9). Without wishing to be bound by theory, it is believed that a polishing composition having a pH lower than 7 would significantly increase corrosion and particle reside, and a polishing composition having a pH higher than 14 can affect the stability of the suspended abrasive and would significantly increase the roughness and decrease the overall quality of a film polished by such a composition. In order to obtain the desired pH, the relative concentrations of the ingredients in the polishing compositions described herein can be adjusted.

In one or more embodiments, the polishing composition described herein can include at least one (e.g., two or three) barrier film removal rate enhancer. In some embodiments, the at least one barrier film removal rate enhancer is an organic acid (such as a carboxylic acid, an amino acid, a sulfonic acid, a phosphoric acid, or a phosphonic acid) or a salt thereof. In some embodiments, the barrier film removal rate enhancer can be an organic acid or a salt thereof selected from the group consisting of gluconic acid, lactic acid, citric acid, tartaric acid, malic acid, glycolic acid, malonic acid, formic acid, oxalic acid, acetic acid, propionic acid, peracetic acid, succinic acid, potassium acetate, potassium citrate, amino acetic acid, phenoxyacetic acid, bicine, diglycolic acid, glyceric acid, tricine, alanine, histidine, valine, isoleucine, leucine, methionine, phenylalanine, cysteine, selenocysteine, glycine, proline, serine, threonine, asparagine, glutamine, aspartic acid, glutamic acid, arginine, histidine, lysine, tyrosine, tryptophan, benzoic acid, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethanesulfonic acid, ethyl phosphoric acid, cyanoethyl phosphoric acid, phenyl phosphoric acid, vinyl phosphoric acid, poly(vinylphosphonic acid), 1-hydroxyethane-1,1-diphosphonic acid, nitrilotri(methylphosphonic acid), diethylenetriaminepentakis (methylphosphonic acid), N,N,N',N'-ethylenediaminetetrakis(methylene phosphonic acid), n-hexylphosphonic acid, benzylphosphonic acid, phenylphosphonic acid, ethylenediaminetetracetic acid, iminodiacetic acid, N-hydroxyethyl-ethylenediaminetriacetic acid, nitrilotriacetic acid, diethylenetriaminepentacetic acid, hydroxyethylethylenediaminetriacetic acid, triethylenetetraaminehexaacetic acid, diaminocycloheanetetraacetic acid, nitrilotrimethylphosphonic acid, ethylenediaminetetra (methylenephosphonic acid), 1-hydroxyl ethylidene-1,1,-diphosphonic acid, diethylenetriamine penta(methylene phosphonic acid), salts thereof, and mixtures thereof. In one or more embodiments, the composition can include a second barrier film removal rate enhancer that is selected from nitric acid, sulfuric acid, hydrochloric acid, phosphoric acid, or combinations thereof. Without wishing to be bound by theory, it is surprising that an organic acid or a salt thereof (such as those described above) can be used as an effective barrier removal rate enhancer in the polishing composition described herein to improve the removal rate of a barrier film (e.g., a Ta or TaN film) in a semiconductor substrate.

In some embodiments, the barrier film removal rate enhancer is in an amount of from at least about 0.02% (e.g., at least about 0.05%, at least about 0.1%, at least about 0.2%, at least about 0.4%, at least about 0.5%, at least about 0.6%, at least about 0.8%, at least about 1%, at least about 1.5%, or at least about 2%) by weight to at most about 4% (e.g., at most about 3.5%, at most about 3%, at most about 2.5%, at most about 2%, at most about 1.5%, or at most about 1%) by weight of the polishing composition described herein.

In one or more embodiments, the polishing composition described herein can include at least one (e.g., two or three) low-k removal rate inhibitor. In some embodiments, the at least one low-k removal rate inhibitor is a nonionic surfactant. In some embodiments, the nonionic surfactant is the only low-k removal rate inhibitor in the polishing composition. In one or more embodiments, the nonionic surfactant is selected from the group consisting of alcohol alkoxylates, alkylphenol alkoxylates, tristyrylphenol alkoxylates, sorbitan ester alkoxylates, polyalkoxylates, polyalkylene oxide block copolymers, alkoxylated diamines, and mixtures thereof. In one or more embodiments, the nonionic surfactant is a polymer having a number average molecular weight of at least about 1,000 g/mol, or at least about 2,500 g/mol, or at least about 5,000 g/mol, or at least about 7,500 g/mol, or at least about 10,000 g/mol. In one or more embodiments, the nonionic surfactant is a polymer having a number average molecular weight of at most about 1,000,000 g/mol, or at most about 750,000 g/mol, or at most about 500,000 g/mol, or at most about 250,000 g/mol, or at most about 100,000 g/mol. In one or more embodiments, the alkoxylate groups of the alkoxylated nonionic surfactants are ethoxylate, propoxylate, or a combination of ethoxylate and propoxylate groups. Without wishing to be bound by theory, it is surprising that a nonionic surfactant (such as those described above) can be used as a low-k removal rate inhibitor in the polishing composition described herein to reduce or minimize the removal rate of a low-k film (e.g., a carbon doped silicon oxide film) in a semiconductor substrate. In some embodiments, the polishing composition described herein does not include alkylphenol alkoxylates.

In some embodiments, the low-k removal rate inhibitor is in an amount of from at least about 0.005% (e.g., at least about 0.01%, at least about 0.05%, at least about 0.1%, at least about 0.5%, at least about 1%, at least about 1.5%, at least about 2%, or at least about 3%) by weight to at most about 5% (e.g., at most about 4.5%, at most about 4%, at most about 3.5%, at most about 3%, at most about 2.5%, at most about 2%, at most about 1.5%, at most about 1%, at most about 0.5%, or at most about 0.1%) by weight of the polishing composition described herein.

In one or more embodiments, the polishing composition described herein can include at least one (e.g., two or three) azole-containing corrosion inhibitor. In some embodiments, the at least one azole compound is selected from the group consisting of substituted or unsubstituted triazoles, substituted or unsubstituted tetrazoles, substituted or unsubstituted benzotriazoles, substituted or unsubstituted pyrazoles, substituted or unsubstituted imidazoles, substituted or unsubstituted benzimidazoles, substituted or unsubstituted thiadiazoles, substituted or unsubstituted thiabendazole, substituted or unsubstituted adenines, substituted or unsubstituted xanthines, and substituted or unsubstituted guanines. In one or more embodiments, the azole compound can be selected from the group consisting of 1,2,4-triazole, 1,2,3-triazole, tetrazole, benzotriazole, tolyltriazole, methyl benzotriazole (e.g., 1-methyl benzotriazole, 4-methyl benzotriazole, or 5-methyl benzotriazole), ethyl benzotriazole (e.g., 1-ethyl benzotriazole), propyl benzotriazole (e.g., 1-propyl benzotriazole), butyl benzotriazole (e.g., 1-butyl benzotriazole or 5-butyl benzotriazole), pentyl benzotriazole (e.g., 1-pentyl benzotriazole), hexyl benzotriazole (e.g., 1-hexyl benzotriazole or 5-hexyl benzotriazole), dimethyl benzotriazole (e.g., 5,6-dimethyl benzotriazole), chloro benzotriazole (e.g., 5-chloro benzotriazole), dichloro benzotriazole (e.g., 5,6-dichloro benzotriazole), chloromethyl benzotriazole (e.g., 1-(chloromethyl)-1-H-benzotriazole), chloroethyl benzotriazole, phenyl benzotriazole, benzyl benzotriazole, aminotriazole, aminobenzimidazole, aminotetrazole, pyrazole, imidazole, adenine, xanthine, guanine, benzimidazole, thiabendazole, 1-hydroxybenzotriazole, 2-methylbenzothiazole, 2-aminobenzimidazole, 2-amino-5-ethyl-1,3,4-thiadiazole, 3,5-diamino-1,2,4-triazole, 3-amino-5-methylpyrazole, 4-amino-4H-1,2,4-triazole, and mixtures thereof. Without wishing to be bound by theory, it is believed that an azole compound (such as those described above) can significantly reduce or minimize the removal rate of metals (e.g., copper) in a semiconductor substrate.

In some embodiments, the azole-containing corrosion inhibitor is in an amount of from at least about 0.0001% (e.g., at least about 0.0002%, at least about 0.0005%, at least about 0.001%, at least about 0.002%, at least about 0.005%, at least about 0.01%, at least about 0.02%, at least about 0.05%, at least about 0.1%, at least about 0.2%, or at least about 0.5%) by weight to at most about 1% (e.g., at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

An optional oxidizer can be added when diluting a concentrated slurry to form a POU slurry. The oxidizer can be selected from the group consisting of hydrogen peroxide, ammonium persulfate, silver nitrate ($AgNO_3$), ferric nitrates or chlorides, per acids or salts, ozone water, potassium ferricyanide, potassium dichromate, potassium iodate, potassium bromate, potassium periodate, periodic acid, vanadium trioxide, hypochlorous acid, sodium hypochlorite, potassium hypochlorite, calcium hypochlorite, magnesium hypochlorite, ferric nitrate, potassium permanganate, other inorganic or organic peroxides, and mixtures thereof. In some embodiments, the oxidizer is hydrogen peroxide.

In some embodiments, the oxidizer is in an amount of from at least about 0.05% (e.g., at least about 0.1%, at least about 0.2%, at least about 0.4%, at least about 0.5%, at least about 1%, at least about 1.5%, at least about 2%, at least about 2.5%, at least about 3%, at least about 3.5%, at least about 4%, or at least about 4.5%) by weight to at most about 5% (e.g., at most about 4.5%, at most about 4%, at most about 3.5%, at most about 3%, at most about 2.5%, at most about 2%, at most about 1.5%, at most about 1%, at most about 0.5%, or at most about 0.1%) by weight of the polishing composition described herein. In some embodiments, without wishing to be bound by theory, it is believed that the oxidizer can help remove metal films by forming a metal complex with a chelating agent so that the metal can be removed during the CMP process. In some embodiments, without wishing to be bound by theory, it is believed that the metal complex formed between a metal film and an oxidizer can form a passivation layer, which can protect the metal from corrosion. In some embodiments, the oxidizer may reduce the shelf life of a polishing composition. In such embodiments, the oxidizer can be added to the polish composition at the point of use right before polishing.

In some embodiments, the polishing composition described herein can include a solvent (e.g., a primary solvent), such as water. In some embodiments, the solvent (e.g., water) is in an amount of from at least about 20% (e.g., at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 92%, at least about 94%, at least about 95%, or at least about 97%) by weight to at most about 99% (e.g., at most about 98%, at most about 96%, at most about 94%, at most about 92%, at most about 90%, at most about 85%, at most about 80%, at most about 75%, at most about 70%, or at most about 65%) by weight of the polishing composition described herein.

In one or more embodiments, an optional secondary solvent (e.g., an organic solvent) can be used in the polish composition (e.g., the POU or concentrated polishing composition) of the present disclosure, which can help with the dissolution of the azole-containing corrosion inhibitor. In one or more embodiments, the secondary solvent can be one or more alcohols, alkylene glycols, or alkylene glycol ethers. In one or more embodiments, the secondary solvent comprises one or more solvents selected from the group consisting of ethanol, 1-propanol, 2-propanol, n-butanol, propylene glycol, 2-methoxyethanol, 2-ethoxyethanol, propylene glycol propyl ether, and ethylene glycol.

In some embodiments, the secondary solvent is in an amount of from at least about 0.0025% (e.g., at least about 0.005%, at least about 0.01%, at least about 0.02%, at least about 0.05%, at least about 0.1%, at least about 0.2%, at least about 0.4%, at least about 0.6%, at least about 0.8%, or at least about 1%) by weight to at most about 2% (e.g., at most about 1.8%, at most about 1.6%, at most about 1.5%, at most about 1.4%, at most about 1.2%, at most about 1%, at most about 0.8%, at most about 0.6%, at most about 0.5%, or at most about 0.1%) by weight of the polishing composition described herein.

In one or more embodiments, the polishing composition described herein can include at least one (e.g., two or three) anionic polymer. In one or more embodiments, the at least one anionic polymer can include one or more anionic groups, such as carboxylate, sulfate, and phosphate groups. In one or more embodiments, the at least one anionic polymer is formed from one or more monomers selected from the group consisting of (meth)acrylic acid, maleic acid, acrylic acid, vinyl phosphonic acid, vinyl phosphoric acid, vinyl sulfonic acid, allyl sulfonic acid, styrene sulfonic acid, acrylamide, acrylamidopropyl sulfonic acid, and sodium phosphinite. In more specific embodiments, the at least one anionic polymer can be selected from the group consisting of poly(4-styrenylsulfonic) acid (PSSA), polyacrylic acid (PAA), poly(vinylphosphonic acid) (PVPA), poly(2-acrylamido-2-methyl-1-propanesulfonic acid), poly(N-vinylacetamide) (PNVA), polyethylenimine (PEI), anionic poly (methyl methacrylate) (PMMA), anionic polyacrylamide (PAM), polyaspartic acid (PASA), anionic poly(ethylene succinate) (PES), anionic polybutylene succinate (PBS), poly(vinyl alcohol) (PVA), 2-propenoic acid copolymer with 2-methyl-2-((1-oxo-2-propenyl)amino)-1-propanesulfonic acid monosodium salt and sodium phosphinite, 2-propenoic acid copolymer with 2-methyl-2-((1-oxo-2-propenyl) amino)-1-propanesulfonic acid monosodium salt and sodium hydrogen sulfite sodium salt, and 2-acrylamido-2-methyl-1-propanesulfonic acid-acrylic acid copolymer, poly (4-styrenesulfonic acid-co-acrylic acid-co-vinylphosphonic acid) terpolymer, phosphinocarboxylic acid, hydrolyzed polymaleic anhydride, and mixtures thereof. Without wishing to be bound by theory, it is believed that the anionic polymer can facilitate the solubilization of oxidized ruthenium species created during the polishing process while also reducing the electrostatic force between the abrasive particles and a ruthenium surface.

In one or more embodiments, the at least one anionic polymer can have a weight average molecular weight ranging from at least about 250 g/mol (e.g., at least about 500 g/mol, at least about 1000 g/mol, at least about 2,000 g/mol, at least about 5,000 g/mol, at least about 50,000 g/mol, at least about 100,000 g/mol, at least about 200,000 g/mol, or at least about 250,000 g/mol) to at most about 500,000 g/mol (e.g., at most about 400,000 g/mol, at most about 300,000 g/mol, at most about 200,000 g/mol, at most about 100,000 g/mol, or at most about 50,000 g/mol, or at most about 10,000 g/mol). In some embodiments, the at least one anionic polymer can have a weight average molecular weight ranging from at least about 1000 g/mol to at most about 10,000 g/mol. In some embodiments, the at least one anionic polymer can have a weight average molecular weight ranging from at least about 2000 g/mol to at most about 6,000 g/mol. In yet some embodiments, the at least one anionic polymer can have a weight average molecular weight of about 5,000 g/mol.

In some embodiments, the polishing composition described herein includes one anionic polymer such as poly(vinylphosphonic acid), 2-acrylamido-2-methyl-1-propanesulfonic acid-acrylic acid copolymer, or poly(4-styrenesulfonic acid-co-acrylic acid-co-vinylphosphonic acid) terpolymer. In some embodiments, the polishing composition described herein includes two anionic polymers, such as (1) poly(4-styrenylsulfonic) acid and poly(acrylic) acid or (2) 2-acrylamido-2-methyl-1-propanesulfonic acid-acrylic acid copolymer and poly(acrylic) acid.

In one or more embodiments, the at least one anionic polymer is included in the composition in an amount from about 0.00001% to about 50% by weight of the cleaning composition. For example, the at least one anionic polymer can be at least about 0.00001% (e.g., at least about 0.00005%, at least about 0.0001%, at least about 0.0005%, at least about 0.001%, at least about 0.005%, at least about 0.01%, at least about 0.05%, at least about 0.1%, at least about 0.5%, or at least about 1%) to at most about 50% (e.g., at most about 45%, at most about 40%, at most about 35%, at most about 30%, at most about 25%, at most about 20%, at most about 15%, at most about 10%, at most about 5%, or at most about 1%) by weight of the cleaning composition described herein.

In one or more embodiments, the polishing composition described herein can be substantially free of one or more of certain ingredients, such as organic solvents, pH adjusting agents, zwitterionic compounds, quaternary ammonium compounds (e.g., salts such as tetraalkylammonium salts and hydroxides such as tetraalkylammonium hydroxide), alkali bases (such as alkali hydroxides), fluorine-containing compounds (e.g., fluoride compounds or fluorinated compounds (such as fluorinated polymers/surfactants)), silicon-containing compounds such as silanes (e.g., alkoxysilanes), nitrogen containing compounds (e.g., amino acids, amines, or imines (e.g., amidines such as 1,8-diazabicyclo[5.4.0]-7-undecene (DBU) and 1,5-diazabicyclo[4.3.0]non-5-ene (DBN)), amides, or imides), salts (e.g., halide salts or metal salts), polymers (e.g., non-ionic, cationic, anionic, or water-soluble polymers), inorganic acids (e.g., hydrochloric acid, sulfuric acid, phosphoric acid, or nitric acid), surfactants (e.g., cationic surfactants, anionic surfactants, non-polymeric surfactants, or non-ionic surfactants), plasticizers, oxidizing agents (e.g., hydrogen peroxide and periodic acid), corrosion inhibitors (e.g., azole or non-azole corrosion inhibitors), electrolytes (e.g., polyelectrolytes), and/or certain abrasives (e.g., polymeric abrasives, fumed silica, ceria abrasives, non-ionic abrasives, surface modified abrasives, negatively/positively charged abrasives, or ceramic abrasive composites). The halide salts that can be excluded from the polishing compositions include alkali metal halides (e.g., sodium halides or potassium halides) or ammonium halides (e.g., ammonium chloride), and can be fluorides, chlorides, bromides, or iodides. As used herein, an ingredient that is "substantially free" from a polishing composition refers to an ingredient that is not intentionally added into the polishing composition. In some embodiments, the polishing composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing composition. In some embodiments, the polishing compositions described herein can be completely free of one or more of the above ingredients.

In one or more embodiments, the polishing composition described herein can have a ratio of a removal rate for silicon oxides (e.g., TEOS) to a removal rate for Cu (i.e., a removal rate selectivity) of from at least about 0.5:1 (e.g., at least about 0.6:1, at least about 0.7:1, or at least about 0.8:1) to at most about 2:1 (e.g., at most about 1.8:1, at most about 1.6:1, at most about 1.4:1, at most about 1.2:1, or at most about 1:1). It is to be noted that the term "silicon oxide" described herein is expressly intended to include both un-doped and doped versions of silicon oxide. In some embodiments, the silicon oxide can be doped with at least one dopant selected from carbon, nitrogen, oxygen, hydrogen, or any other known dopants for silicon oxide. Some examples of silicon oxide film types include TEOS (tetra-ethyl orthosilicate), SiOC, SiOCN, SiOCH, SiOH and SiON. In one or more embodiments, the ratios and/or removal rates described above can be applicable when measuring removal rates for polishing either blanket wafers or patterned wafers (e.g., wafers including conductive layers, barrier layers, and/or dielectric layers).

In one or more embodiments, the total defect counts on a wafer (e.g., on a copper surface of a wafer) having a diameter of 12 inches (i.e., about 300 mm) is at most 800 (e.g., at most 700, at most 600, at most 500, at most 400, at most 300, at most 250, at most 200, at most 150, at most 100, or at most 50) when polishing the wafer using a polishing composition according to the present disclosure. In one or more embodiments, the defects may result from scratches, organic residue, particle contamination (e.g., abrasive), and combinations thereof. In general, the defects may be counted by using a laser scattering inspection system and then analyzed and classified by reviewing images of the polished wafer taken using a scanning electron microscope (SEM). In one or more embodiments, the defects counted are those at least about 100 nm in size.

The present disclosure also contemplates a method of using any of the above-described polishing compositions (e.g., concentrates or POU slurries). With the concentrate, the method can comprise the steps of diluting the concentrate to form a POU slurry (e.g., by a factor of at least two), and then contacting a surface at least partially comprising copper with the POU slurry. In some embodiment, an oxidizer can be added to the slurry before or after the dilution. With the POU slurry, the method comprises the step of contacting the surface at least partially comprising copper with the polishing composition.

In one or more embodiments, this disclosure features a polishing method that can include applying a polishing composition according to the present disclosure to a substrate (e.g., a wafer) having at least copper and silicon oxide on a surface of the substrate; and bringing a pad into contact with the surface of the substrate and moving the pad in relation to the substrate. Further, in some embodiments, after polishing a substrate with a polishing composition described herein the polished substrate may undergo a rinse polishing process where a composition including all the components of the polishing composition, except the abrasive, is applied to the polished substrate in the polishing tool and the pad of the polishing tool is brought into contact with the substrate and moved in relation to the substrate to create a rinse polished substrate. In some embodiments, after the polishing process or the rinse polishing process the substrate may be removed from the polishing tool and subjected to a post-CMP cleaning in a cleaning tool (e.g., a brush scrubber or a spin rinse dryer).

In some embodiments, the method that uses a polishing composition described herein can further include producing a semiconductor device from the substrate treated by the polishing composition through one or more steps. For example, photolithography, ion implantation, dry/wet etching, plasma ashing, deposition (e.g., PVD, CVD, ALD, ECD), wafer mounting, die cutting, packaging, and testing can be used to produce a semiconductor device from the substrate treated by the polishing composition described herein.

The specific examples below are to be construed as merely illustrative, and not limitative of the remainder of the disclosure in any way whatsoever. Without further elaboration, it is believed that one skilled in the art can, based on the description herein, utilize the present invention to its fullest extent.

EXAMPLES

In these examples, the polishing was performed on 200 mm wafers, using an AMAT Mirra CMP polisher, a Fujibo H804 pad, a downforce pressure of 1.7 psi, a platen head velocity of 120/114 rpm, and a slurry flow rate between of 150 mL/min and 225 mL/min.

The general compositions used in the examples are shown in Table 1 below. The specifics details on the differences in the compositions tested will be explained in further detail when discussing the respective examples.

TABLE 1

| Component | % By Weight of Composition |
| --- | --- |
| Inorganic base pH adjuster | 0.05-2.5 |
| Organic base pH adjuster | 0.05-2.5 (if used) |
| Barrier Film Removal Rate Enhancer (Acid) | 0.02-2 |
| Low-k Removal Rate Inhibitor | 0.01-1 |
| Azole-Containing Corrosion Inhibitor | 0.0001-0.1 |
| Abrasive (silica) | 0.1-12 |
| Anionic Polymer (if present) | 0.001-1 |
| Oxidizer | 0.1-5 |
| Solvent (DI Water) | 80-99 |
| pH | 7-12 |

Example 1

Table 2 below shows the removal rate for Cu, TEOS, TaN, and Black Diamond 1 (BD), when polished using Composition 1-6. Compositions 1-6 contained the same ingredients at the same concentrations except for the differences in the molar ratio of the organic base to the inorganic base identified in Table 2. Composition 1 included only the inorganic base, while Composition 6 included only the organic base and both served as controls. Each of Compositions 2-5 included a combination of an organic base and an inorganic base at several molar ratios, as shown in Table 2. The BD blanket wafer is a low-k dielectric material (i.e., carbon doped silicon oxides) coated on silicon wafers.

The results show, surprisingly, that the combination of the organic base and the inorganic base were able to protect both the Cu and the TEOS more effectively (as shown by their lower removal rates) than Composition 1 (which contained an inorganic base but had no organic base). Importantly, the Cu and TEOS removal rates decreased in similar degrees and generally produced a 1:1 removal rate ratio, which is preferred in some applications. Composition 6 (which contained an organic base but had no inorganic base) was unable to maintain a 1:1 Cu and TEOS removal rate ratio due to a drastically lower and industrially unacceptable copper removal rate.

TABLE 2

| | Comp. 1 Control Inorganic Base Only | Comp. 2 MR = 0.34 | Comp. 3 MR = 0.74 | Comp. 4 MR = 1.14 | Comp. 5 MR = 1.56 | Comp. 6 Control Organic Base Only |
| --- | --- | --- | --- | --- | --- | --- |
| TEOS RR (Å/min) | 111 | 98 | 90 | 79 | 69 | 52 |
| Cu RR (Å/min) | 110 | 98 | 90 | 75 | 64 | 37 |

TABLE 2-continued

| | Comp. 1 Control Inorganic Base Only | Comp. 2 MR = 0.34 | Comp. 3 MR = 0.74 | Comp. 4 MR = 1.14 | Comp. 5 MR = 1.56 | Comp. 6 Control Organic Base Only |
|---|---|---|---|---|---|---|
| BD RR (Å/min) | 15 | 16 | 17 | 17 | 19 | 18 |
| TaN RR (Å/min) | 250 | 242 | 220 | 205 | 173 | 151 |

RR = removal rate - MR = Molar Ratio of Organic Base to Inorganic Base

Example 2

Table 3 below shows the removal rate for Cu and TEOS blanket wafers when polished using Polishing Compositions 1 and 3, which are detailed in Table 1 above, and newly presented Compositions 7-11. Composition 1, 3, and 7-11 contained the same ingredients at the same concentrations except for the differences identified below and in Table 3. Specifically, Composition 1 included only inorganic base, while Compositions 3 and 7-11 all included a combination of an organic base and inorganic base in a molar ratio of 0.74 (Organic:Inorganic). The organic base in Compositions 3 and 7-11 were all different alkylammonium hydroxides. The organic base in Compositions 10 and 11 were alkylammonium hydroxides that include covalently bound hydroxyl groups, while Compositions 3 and 7-9 are alkylammonium hydroxides that did not include covalently bound hydroxyl groups.

The results show that Compositions 3 and 7-9, containing the alkylammonium hydroxides without covalently bound hydroxyl groups, were able to more effectively protect both the Cu and the TEOS (as shown by their lower removal rates) than Composition 1 (which contained an inorganic base but had no organic base). Further, Compositions 3 and 7-9 all maintained the 1:1 Cu and TEOS removal rate ratio, which is preferred in some applications. Surprisingly, Compositions 10 and 11, containing the alkylammonium hydroxides including covalently bound hydroxyl groups, both produced excessively high TEOS removal rates and a TEOS to copper removal rate ratio of 2:1.

TABLE 3

| | Comp. 1 Control Inorganic Base Only | Comp. 3 Org. Base 1 | Comp. 7 Org. Base 2 | Comp. 8 Org. Base 3 | Comp. 9 Org. Base 4 | Comp. 10 Org. Base 5 | Comp. 11 Org. Base 6 |
|---|---|---|---|---|---|---|---|
| TEOS RR (Å/min) | 111 | 90 | 96 | 90 | 88 | 175 | 200 |
| Cu RR (Å/min) | 110 | 90 | 92 | 86 | 84 | 95 | 99 |

Example 3

Table 4 below shows the dissolution value (ppb) for CuO and $RuO_2$ particles incubated in Composition 1 and Composition 3. In the experiment, 0.005 grams of $RuO_2$ particles or 0.01 grams of CuO particles were dynamically incubated with either of the compositions for one minute at room temperature. After this incubation, the mixture was centrifuged for 40 minutes and the amount of Cu or Ru dissolved in the supernatant after the incubation was measured by ICP-MS.

The results show that, surprisingly, Composition 3 (which contained a mixture of an inorganic base and an organic base) significantly increased the dissolution of copper oxides (a primary residue) and ruthenium oxides. This result indicates that Composition 3 should more effectively remove abraded particles and therefore leave behind a cleaner surface than Composition 1.

TABLE 4

| | CuO (ppb) | $RuO_2$ (ppb) |
|---|---|---|
| Comp. 1 Control Inorganic Base Only | 4491 | 25 |
| Comp. 3 Org. Base 1 | 10815 | 390 |

Example 4

Table 5 below shows the results of Time-of-Flight Secondary Ion Mass Spectrometry (TOF-SIMS) analysis of ruthenium residue on the copper portion of patterned coupons that were polished with compositions that included an anionic polymer (e.g., Compositions 13-21) and that did not include an anionic polymer (i.e., the control Comp. 12). The results in Table 5 are the average of multiple analyses and a lower numerical value indicates less ruthenium residue.

Compositions 13-20 each included a chemically distinct anionic polymer and Composition 21 included the same anionic polymer as Composition 17 along with a small amount $NH_4OH$ (e.g., 0.001-0.05 wt. %). The results show that the inclusion of an anionic polymer significantly reduced the amount of ruthenium residue detected on the copper portion of the polished coupons when compared with Control Composition 12. Further, the addition of $NH_4OH$ in Composition 21 surprisingly enhanced the ruthenium residue removal.

TABLE 5

| Comp. 12 Control | Comp. 13 | Comp. 14 | Comp. 15 | Comp. 16 | Comp. 17 | Comp. 18 | Comp. 19 | Comp. 20 | Comp. 21 |
|---|---|---|---|---|---|---|---|---|---|
| 0.39 | 0.29 | 0.27 | 0.29 | 0.17 | 0.28 | 0.29 | 0.27 | 0.27 | 0.14 |

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A polishing composition, comprising:
an abrasive;
at least two pH adjusters comprising at least one inorganic base and at least one organic base, wherein the molar ratio of the at least one organic base to the at least one inorganic base is from about 0.05 to about 2;
a barrier film removal rate enhancer;
a low-k removal rate inhibitor; and
an azole-containing corrosion inhibitor.

2. The polishing composition of claim 1, wherein the abrasive is selected from the group consisting of alumina, silica, titania, ceria, zirconia, co-formed products of alumina, silica, titania, ceria, or zirconia, coated abrasives, surface modified abrasives, and mixtures thereof.

3. The polishing composition of claim 1, wherein the abrasive is in an amount of from about 0.1% to about 50% by weight of the composition.

4. The polishing composition of claim 1, wherein the molar ratio of the at least one organic base to the at least one inorganic base is from about 0.5 to about 2.

5. The polishing composition of claim 1, wherein the at least one inorganic base comprises a base selected from the group consisting of ammonium hydroxide, sodium hydroxide, potassium hydroxide, cesium hydroxide, rubidium hydroxide, and any combinations thereof.

6. The polishing composition of claim 1, wherein the at least one organic base comprises a quaternary ammonium hydroxide, a quaternary phosphonium hydroxide, or a guanidine compound.

7. The polishing composition of claim 6, wherein the quaternary ammonium hydroxide or quaternary phosphonium hydroxide is selected from the group consisting of tetrabutylammonium hydroxide, ethyltrimethylammonium hydroxide, tetrapropylammonium hydroxide, tetraethylammonium hydroxide, tetramethylammonium hydroxide, diethyldimethylammonium hydroxide, dimethyldipropylammonium hydroxide, benzyltrimethylammonium hydroxide, tetramethylphosphonium hydroxide, tetraethylphosphonium hydroxide, tetrapropylphosphonium hydroxide, tetrabutylphosphonium hydroxide, tetrapentylphosphonium hydroxide, triethyl-methyl-phosphonium hydroxide, tetrakis (hydroxymethyl)phosphonium hydroxide, tetraphenylphosphonium hydroxide, and any combination thereof.

8. The polishing composition of claim 6, wherein the quaternary ammonium hydroxide or quaternary phosphonium hydroxide does not include covalently bound hydroxyl groups.

9. The polishing composition of claim 1, wherein the combined amount of the pH adjusters is in an amount of from about 0.05% to about 10% by weight of the composition.

10. The polishing composition of claim 1, wherein the barrier film removal rate enhancer is an organic acid or a salt thereof selected from the group consisting of gluconic acid, lactic acid, citric acid, tartaric acid, malic acid, glycolic acid, malonic acid, formic acid, oxalic acid, acetic acid, propionic acid, peracetic acid, succinic acid, potassium acetate, potassium citrate, amino acetic acid, phenoxyacetic acid, bicine, diglycolic acid, glyceric acid, tricine, alanine, histidine, valine, isoleucine, leucine, methionine, phenylalanine, cysteine, selenocysteine, glycine, proline, serine, threonine, asparagine, glutamine, aspartic acid, glutamic acid, arginine, histidine, lysine, tyrosine, tryptophan, benzoic acid, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethane-sulfonic acid, ethyl phosphoric acid, cyanoethyl phosphoric acid, phenyl phosphoric acid, vinyl phosphoric acid, poly(vinylphosphonic acid), 1-hydroxyethane-1,1-diphosphonic acid, nitrilotri(methylphosphonic acid), diethylenetriaminepentakis (methylphosphonic acid), N,N,N',N'-ethylenediaminetetrakis(methylene phosphonic acid), n-hexylphosphonic acid, benzylphosphonic acid, phenylphosphonic acid, ethylenediaminetetracetic acid, iminodiacetic acid, N-hydroxyethyl-ethylenediaminetriacetic acid, nitrilotriacetic acid, diethylenetriaminepentacetic acid, hydroxyethylethylenediaminetriacetic acid, triethylenetetraaminehexaacetic acid, diaminocycloheanetetraacetic acid, nitrilotrimethylphosphonic acid, ethylenediaminetetra (methylenephosphonic acid), 1-hydroxyl ethylidene-1,1,-diphosphonic acid, diethylenetriamine penta (methylene phosphonic acid), salts thereof, and mixtures thereof.

11. The polishing composition of claim 1, wherein the barrier film removal rate enhancer is in an amount of from about 0.02% to about 4% by weight of the composition.

12. The polishing composition of claim 1, wherein the low-k removal rate inhibitor is a nonionic surfactant.

13. The polishing composition of claim 12, where the nonionic surfactant is selected from the group consisting of alcohol alkoxylates, alkylphenol alkoxylates, tristyrylphenol alkoxylates, sorbitan ester alkoxylates, polyalkoxylates, polyalkylene oxide block copolymers, alkoxylated diamines, and mixtures thereof.

14. The polishing composition of claim 1, wherein the low-k removal rate inhibitor is in an amount of from about 0.005% to about 5% by weight of the composition.

15. The polishing composition of claim 1, wherein the azole-containing corrosion inhibitor is selected from the group consisting of triazole, tetrazole, benzotriazole, tolyltriazole, methyl benzotriazole, ethyl benzotriazole, propyl benzotriazole, butyl benzotriazole, pentyl benzotriazole, hexyl benzotriazole, dimethyl benzotriazole, chloro benzotriazole, dichloro benzotriazole, chloromethyl benzotriazole, chloroethyl benzotriazole, phenyl benzotriazole, benzyl benzotriazole, aminotriazole, aminobenzimidazole, pyrazole, imidazole, aminotetrazole, adenine, xanthine, guanine, benzimidazole, thiabendazole, 1-hydroxybenzotriazole, 2-methylbenzothiazole, 2-aminobenzimidazole, 2-amino-5-ethyl-1,3,4-thiadiazole, 3,5-diamino-1,2,4-triazole, 3-amino-5-methylpyrazole, 4-amino-4H-1,2,4-triazole, and mixtures thereof.

16. The polishing composition of claim 1, wherein the azole-containing corrosion inhibitor is in an amount of from about 0.0001% to about 1% by weight of the composition.

17. The polishing composition of claim 1, wherein the pH of the composition is from about 7 to about 14.

18. The polishing composition of claim 1, wherein the at least one organic base comprises a first organic base and a second organic base different from the first organic base.

19. The polishing composition of claim 18, wherein the first organic base is an quaternary ammonium hydroxide or a quaternary phosphonium hydroxide and the second organic base is selected from the group consisting of alkylamines, aminoalcohols, guanidines, cyclic amines, and mixtures thereof.

20. The polishing composition of claim 1, further comprising at least one anionic polymer.

21. The polishing composition of claim 20, wherein the at least one anionic polymer is formed from one or more monomers selected from the group consisting of (meth) acrylic acid, maleic acid, acrylic acid, acrylamide, malic acid, methacrylic acid, vinyl phosphonic acid, vinyl sulfonic acid, allyl sulfonic acid, styrene sulfonic acid, acrylamide, acrylamidopropyl sulfonic acid, phosphonic acid, phosphoric acid, vinyl phosphoric acid, butadiene/maleic acid, caprolactam, etherimide, 2-ethyl-2-oxazoline, N-iso-propylacrylamide, sodium phosphinite and co-formed products thereof, and sodium, potassium and ammonium salts thereof.

22. The composition of claim 20, wherein the at least one anionic polymer comprises poly(4-styrenylsulfonic) acid (PSSA), polyacrylic acid (PAA), poly(vinylphosphonic acid) (PVPA), poly(2-acrylamido-2-methyl-1-propanesulfonic acid), poly(N-vinylacetamide) (PNVA), anionic poly (methyl methacrylate) (PMMA), anionic polyacrylamide (PAM), 2-acrylamido-2-methyl-1-propanesulfonic acid-acrylic acid copolymer, poly(4-styrenesulfonic acid-co-acrylic acid-co-vinylphosphonic acid) terpolymer, phosphinocarboxylic acid, hydrolyzed polymaleic anhydride, or a mixture thereof.

23. The composition of claim 20, wherein the at least one anionic polymer is in an amount of from about 0.00001% to about 50% by weight of the cleaning composition.

24. A method of polishing a substrate, comprising the steps of:

applying the polishing composition of claim 1 to a surface of a substrate, wherein the surface comprises copper and silicon oxide; and bringing a pad into contact with the surface of the substrate and moving the pad in relation to the substrate.

* * * * *